United States Patent
Akiyama (10) Patent No.: US 12,424,434 B2
(45) Date of Patent: Sep. 23, 2025

(54) COMPOSITE SUBSTRATE AND PRODUCTION METHOD THEREFOR

(71) Applicant: SHIN-ETSU CHEMICAL CO., LTD., Tokyo (JP)

(72) Inventor: Shoji Akiyama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 96 days.

(21) Appl. No.: 17/906,733

(22) PCT Filed: Apr. 1, 2021

(86) PCT No.: PCT/JP2021/014152
§ 371 (c)(1),
(2) Date: Sep. 19, 2022

(87) PCT Pub. No.: WO2021/201220
PCT Pub. Date: Oct. 7, 2021

(65) Prior Publication Data
US 2023/0207307 A1 Jun. 29, 2023

(30) Foreign Application Priority Data
Apr. 3, 2020 (JP) .................... 2020-067930

(51) Int. Cl.
*H01L 21/02* (2006.01)
*C30B 29/30* (2006.01)
(Continued)

(52) U.S. Cl.
CPC .. *H01L 21/02123* (2013.01); *H01L 21/02255* (2013.01); *H01L 21/02439* (2013.01);
(Continued)

(58) Field of Classification Search
None
See application file for complete search history.

(56) References Cited

U.S. PATENT DOCUMENTS

| 6,146,979 A | 11/2000 | Henley et al. |
| 2008/0194967 A1 | 8/2008 | Sliwa et al. |

(Continued)

FOREIGN PATENT DOCUMENTS

| CN | 1465104 A | 12/2003 |
| CN | 102414785 A | 4/2012 |

(Continued)

OTHER PUBLICATIONS

KR19980064201A, Method for Manufacturing Semiconductor Member, Oct. 7, 1998 (Year: 1998).*

(Continued)

*Primary Examiner* — Alexander G Ghyka
(74) *Attorney, Agent, or Firm* — Myers Bigel, P.A.

(57) ABSTRACT

Provided are a composite substrate in which a wafer to be bonded has a sufficiently small surface roughness and which can be prevented from causing film peeling, and a method for producing the composite substrate. The composite substrate 40 of the present invention has a silicon wafer 10, an interlayer 11, and a single-crystal silicon thin film or oxide single-crystal thin film 20a stacked in the order listed and has a damaged layer 12a in a portion of the silicon wafer 10 on the side of the interlayer 11.

6 Claims, 3 Drawing Sheets (51) Int. Cl.
   *H01L 21/225* (2006.01)
   *H01L 21/304* (2006.01)
   *H01L 21/762* (2006.01)
   *H01L 23/00* (2006.01)

(52) U.S. Cl.
   CPC ........ *H01L 21/2253* (2013.01); *H01L 21/304* (2013.01); *H01L 21/76262* (2013.01); *H01L 24/05* (2013.01); *C30B 29/30* (2013.01); *H01L 2224/0345* (2013.01); *H01L 2224/03452* (2013.01); *H01L 2924/1068* (2013.01)

(56) References Cited

U.S. PATENT DOCUMENTS

| | | | |
|---|---|---|---|
| 2009/0212398 | A1 | 8/2009 | Suzuki et al. |
| 2017/0033764 | A1 | 2/2017 | Inoue et al. |
| 2017/0358484 | A1 | 12/2017 | Liu et al. |
| 2019/0097596 | A1 | 3/2019 | Akiyama et al. |
| 2019/0386640 | A1 | 12/2019 | Akiyama et al. |
| 2020/0058842 | A1 | 2/2020 | Akiyama et al. |
| 2021/0328571 | A1 | 10/2021 | Akiyama |

FOREIGN PATENT DOCUMENTS

| | | | |
|---|---|---|---|
| CN | 108885971 | A | 11/2018 |
| CN | 109891747 | A | 6/2019 |
| JP | 2015050425 | A | 3/2015 |
| JP | 2015176899 | A | 10/2015 |
| JP | 2017200101 | A | 11/2017 |
| JP | 2018117030 | A | 7/2018 |
| JP | 2019193242 | A | 10/2019 |
| JP | 2020036212 | A | 3/2020 |
| KR | 20170077099 | A | 7/2017 | |
| KR | 20180134915 | A | 12/2018 | |
| KR | 20190075924 | A | 7/2019 | |
| KR | 20190100285 | A | 8/2019 | |
| WO | 2015034075 | A1 | 3/2015 | |
| WO | WO-2016081367 | A1 * | 5/2016 | ......... H01L 21/3223 |
| WO | 2018088093 | A1 | 5/2018 | |
| WO | 2021201219 | A1 | 10/2021 | |

OTHER PUBLICATIONS

"English language translation of International Search Report", International Application No. PCT/JP2021/014152, Jun. 22, 2021, 2 pp.
"English language translation of International Search Report", International Application No. PCT/JP2021/014151, Jun. 22, 2021, 3 pp.
"Communication with Supplementary European Search Report", EP Application No. 21779422.1, Apr. 17, 2024, 7 pp.
"Communication with Supplementary European Search Report", EP Application No. 21782255.0, Apr. 17, 2024, 8 pp.
"Communication with Supplementary European Search Report", EP Application No. 21279422.1, Apr. 17, 2024, 7 pp.
Request for the Submission of an Opinion with English Language Translation, KR Application No. 10-2022-7034134, Apr. 14, 2025, 11 pp.
Request for the Submission of an Opinion with English Language Translation, KR Application No. 10-2022-7034135, Apr. 15, 2025, 10 pp.
The First Office Action and English language translation, CN Application No. 202180022998.3, Jun. 27, 2025, 25 pp.
The First Office Action and English language translation, CN Application No. 202180022997.9, Jul. 12, 2025, 23 pp.

* cited by examiner

COMPOSITE SUBSTRATE AND PRODUCTION METHOD THEREFOR

RELATED APPLICATIONS

This application is a 35 U.S.C. § 371 national stage application of PCT Application No. PCT/JP2021/014152, filed on Apr. 1, 2021, which claims priority from Japanese Patent Application No. 2020-067930, filed on Apr. 3, 2020, the contents of which are incorporated herein by reference in their entireties. The above-referenced PCT International Application was published in the Japanese language as International Publication No. WO 2021/201220 A1 on Oct. 7, 2021.

TECHNICAL FIELD

The present invention relates to a composite substrate and to a production method therefor.

BACKGROUND ART

With a view to expanding the application range of conventional functional materials (such as semiconductors and oxide single-crystals), there has recently been extensive developments for bonding substrates of different kinds to each other, thereby achieving higher performance. In the fields of semiconductors, Silicon on Insulator (SOI) and the like are known, whereas in the fields of oxide single-crystals, composite substrates having improved temperature properties are reported which are obtained by bonding an oxide single-crystal substrate such as lithium tantalite ($LiTaO_3$ abbreviated as LT) or lithium neonate ($LiNbO_3$ abbreviated as LN) to sapphire or the like and thinning the resulting oxide single-crystal substrate.

There has also been attempts to provide an interlayer between a functional thin film and a silicon wafer for the purpose of separation. Materials such as $SiO_2$ having high insulation properties, having less high-frequency loss (low dielectric loss), and that are easily processable (easily planarizable) are often used as a material of the interlayer. In order to satisfy the aforesaid properties, a metal oxide (in addition to $SiO_2$, SiON, $TiO_2$, $Al_2O_3$, $Ta_2O_5$, $Nb_2O_5$, $Y_2O_3$, or $ZrO_2$, or also SiN or the like) is frequently selected for the interlayer. A material particularly frequently used is $SiO_2$ obtained by thermal oxidation of silicon. An SOI wafer or "oxide single-crystal on Si wafer" thus obtained (which will hereinafter be called "Piezo-material on insulator: POI") often has excellent properties such as excellent high-frequency properties (low high-frequency loss, improved linearity, and reduced crosstalk) because its active layer is thin.

REFERENCE DOCUMENT LIST

Patent Document

Patent Document 1: US 2017/0033764 A

SUMMARY OF THE INVENTION

Problem to be Solved by the Invention

The aforesaid composite substrate obtained by bonding via an interlayer, however, has a drawback. High resistance silicon is commonly used for a base substrate in order to reduce a high-frequency loss, but it is known that in this case, the upper layer of a silicon wafer is electrically charged and a composite substrate thus obtained has deteriorated properties. To avoid the above problem, a measure is taken to place a carrier trap layer directly below a buried insulating film in SOI (which is generally called "Trap-rich SOI") to give it a function of extinguishing carriers generated. Described specifically, it is common practice to form a carrier trap layer from polycrystalline silicon (poly silicon), which is however accompanied with a problem that a polysilicon layer should be planarized into an atomic level (Ra<1 nm) at the time of bonding in the production procedures of SOI or POI. It is not advisable to planarize polycrystalline silicon from the viewpoint of time or cost because the polishing rate of silicon is slightly different, depending on the orientation thereof.

To overcome the aforesaid problem, the present inventor devised the following method. The method is to implant hydrogen ions into a silicon wafer which will be a base substrate or a wafer having an insulating film formed thereon by thermal oxidation, a CVD method, or a PVD method and thereby form a damaged layer in the upper portion of the silicon substrate by the ion implantation. Patent Document 1 has also proposed the formation of a damaged layer by ion implantation and use of the resulting substrate as a base substrate of a POI wafer. According to Patent Document 1, a carrier trap layer is obtained by "converting the damaged layer into non-single crystal one" by ion implantation. This method is very advantageous because the surface roughness is not greatly deteriorated even after ion implantation and the wafer can be bonded as is. In particular, when a substrate having an atomic-level smooth surface like a silicon wafer subjected to thermal oxidation is ion-implanted, it can be bonded as is without adding a step such as polishing after implantation.

It has been found that such a method however causes a problem. Described specifically, a large number of ions used for ion implantation during the ion implantation treatment remain in the wafer and after bonding, and these excess ions remaining in the wafer reach the bonding interface by the thermal treatment or long-term use and cause film peeling. It is therefore necessary to remove the excess ions before bonding in order to maintain high reliability. Although thermal treatment may be carried out to remove the residual excess ions to outwardly diffuse the excess ions, the ion-implanted silicon wafer generates therein bubbles called "microcavities" by the thermal treatment and has deteriorated surface roughness, and therefore has a surface state inappropriate for bonding.

With the aforesaid problem in view, objects of the present invention are to provide a composite substrate in which a wafer to be bonded has a sufficiently small surface roughness and which is prevented from causing film peeling, and to provide a method for producing the composite substrate.

Means for Solving the Problem

To achieve the aforesaid object, the present invention provides, as one aspect thereof, a method for producing a composite substrate having a silicon wafer, an interlayer, a single-crystal silicon thin film or oxide single-crystal thin film stacked in the order listed, including the steps of: subjecting a silicon wafer to ion implantation treatment and then, thermal treatment to form a damaged layer in an upper-layer portion of the silicon wafer; bonding the silicon wafer and the single-crystal silicon wafer or oxide single-crystal wafer to each other with an interlayer therebetween to obtain a laminate, and thinning the single-crystal silicon wafer or the oxide single-crystal wafer of the laminate into a single-crystal silicon thin film or an oxide crystal thin film.

The interlayer preferably includes $SiO_2$, SiON, SiN, $Al_2O_3$, $TiO_2$, $Ta_2O_5$, $Nb_2O_5$, $Y_2O_3$, or $ZrO_2$.

The interlayer is preferably formed by thermally oxidizing the silicon wafer. Alternatively, the interlayer is preferably formed by a chemical vapor deposition method (CVD method) or a physical vapor deposition method (PVD method).

The ion species to be implanted in the ion implantation treatment are hydrogen atom ions ($H^+$) and the dosage is preferably set between $2.5 \times 10^{16}$ to $5.0 \times 10^{16}$ atoms/cm$^2$. Alternatively, the ion species to be implanted in the ion implantation treatment are hydrogen molecule ions ($H_2^+$) and the dosage is preferably set between $1.25 \times 10^{16}$ to $2.5 \times 10^{16}$ atoms/cm$^2$.

The thermal treatment is preferably performed at a temperature of 400° C. or more.

The single-crystal silicon wafer or the oxide single-crystal wafer of the laminate is preferably thinned by grinding or polishing, or a combination thereof. The method of the present invention may further include a step of subjecting the surface of the single-crystal silicon wafer or the oxide single-crystal wafer to be bonded to ion implantation treatment to form an ion implantation layer in the single-crystal silicon wafer or the oxide single-crystal wafer, and it is preferred to thin the single-crystal silicon wafer or the oxide single-crystal wafer of the laminate by leaving the ion implantation layer as a single-crystal silicon thin film or an oxide single-crystal thin film and releasing the remaining portion of the single-crystal silicon wafer or the oxide single-crystal wafer from the laminate.

In another aspect, the present invention provides a composite substrate having a silicon wafer, an interlayer, and a single-crystal silicon thin film or oxide single-crystal thin film stacked in the order listed, and further having a damaged layer in a portion of the silicon wafer on the side of the interlayer.

The interlayer preferably includes $SiO_2$, SiON, SiN, $Al_2O_3$, $TiO_2$, $Ta_2O_5$, $Nb_2O_5$, $Y_2O_3$, or $ZrO_2$.

The oxide single-crystal thin film preferably includes lithium tantalite (LT) or lithium neonate (LN).

Effects of the Invention

Thus, the present invention provides a composite substrate in which a wafer to be bonded has a sufficiently small surface roughness and which is prevented from causing film peeling, and provides a method for producing the composite substrate.

MODE FOR CARRYING OUT THE INVENTION

The embodiments of the composite substrate and production method therefor according to the present invention will hereinafter be described with reference to the attached drawings, but the scope of the present invention is not limited thereto.

Figure 1:
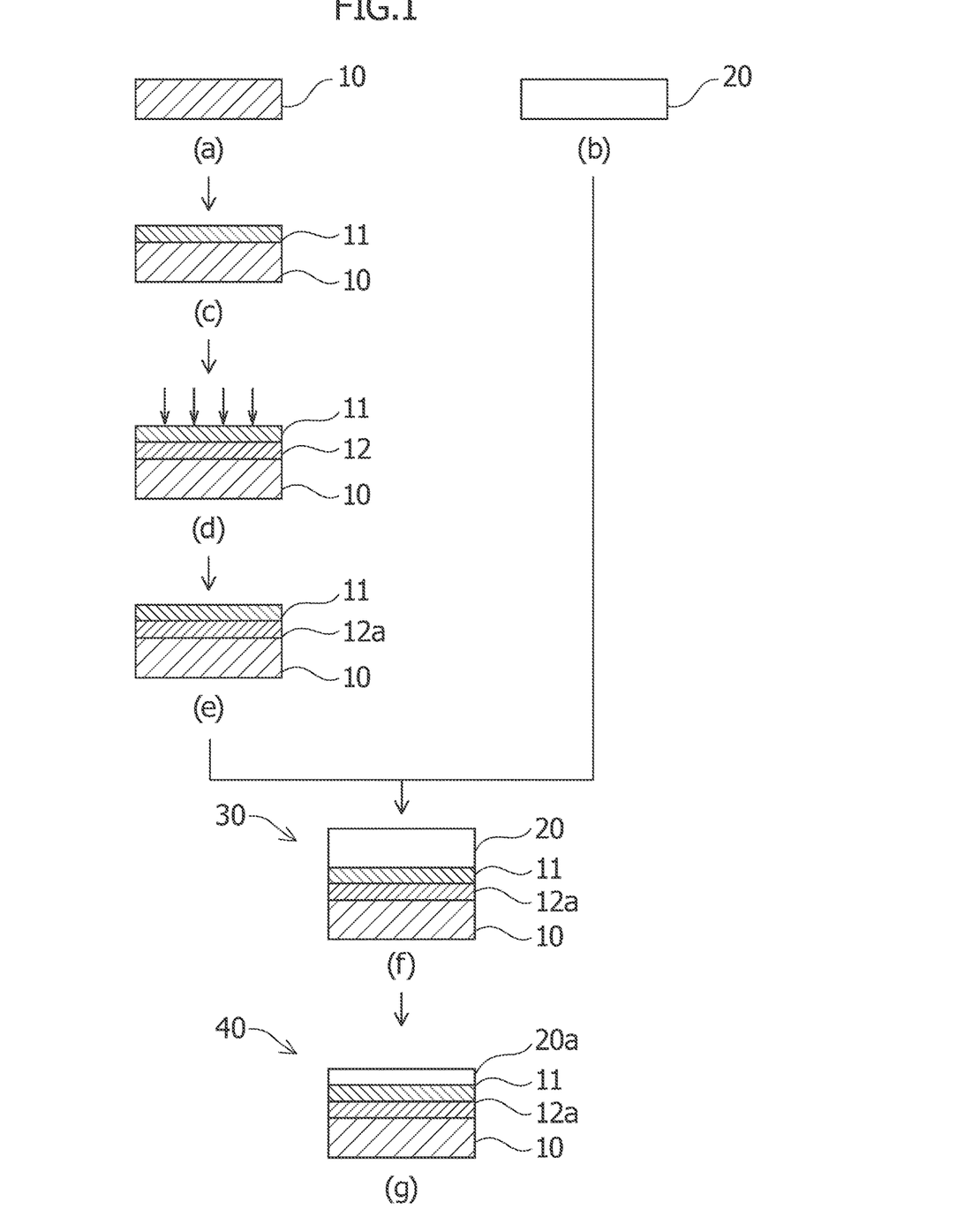
FIG. 1 is a schematic flow chart explaining one embodiment of the method for producing a composite substrate according to the present invention.

The method for producing a composite substrate according to the present embodiment includes, as shown in FIG. 1, a step of preparing a silicon wafer 10 ((a) in FIG. 1), a step of preparing a single-crystal silicon wafer or oxide single-crystal wafer 20 ((b) in FIG. 1), a step of forming an interlayer 11 on the silicon wafer ((c) in FIG. 1), a step of subjecting the silicon wafer 10 on the side of the interlayer 11 to ion implantation treatment ((d) in FIG. 1), a step of subjecting the silicon wafer 10 after the ion implantation treatment to thermal treatment ((e) in FIG. 1), a step of bonding the silicon wafer 10 and the single-crystal silicon wafer or oxide single-crystal wafer 20 to each other via the interlayer 11 and a damaged layer 12a to obtain a laminate 30 ((f) in FIG. 1), and a step of thinning the single-crystal silicon wafer or oxide single-crystal wafer 20 of the laminate 30 into a single-crystal silicon thin film or oxide single-crystal thin film 20a to obtain a composite substrate 40 ((g) in FIG. 1). Each of these steps will hereinafter be described in detail.

The silicon wafer 10 prepared in the step (a) may be a silicon wafer ordinarily used as a supporting wafer of a composite substrate and as for the size, the wafer has, for example, preferably a diameter of 2 to 12 inches and a wafer thickness of 500 to 800 µm.

As for the single-crystal silicon wafer or oxide single-crystal wafer 20 (which may also be called "second wafer 20", hereinafter) prepared in the step (b), the single-crystal silicon wafer is, for example, one grown by the Czochralski method and generally available on the market can be used, and as the oxide single-crystal wafer, a piezoelectric single-crystal, for example, a compound composed of lithium, a metal element such as tantalum or niobium, and oxygen is preferred. Examples of such a compound include lithium tantalite ($LiTaO_3$ abbreviated as "LT") and lithium neonate ($LiNbO_3$ abbreviated as "LN"). The size of the second wafer 20 is not particularly limited, but it may have, for example, a diameter of 2 to 8 inches and a wafer thickness of 100 to 1000 µm.

In the step (c), an interlayer 11 is formed on the surface of the silicon wafer 10 to be bonded. The material of the interlayer 11 preferably has high insulation properties, has less high-frequency loss (low dielectric loss), and is easily processable (planarizable). Examples of the material include, but are not limited to, $SiO_2$, SiON, SiN, $Al_2O_3$, $TiO_2$, $Ta_2O_5$, $Nb_2O_5$, $Y_2O_3$, and $ZrO_2$. The interlayer 11 may be formed, for example, by thermally oxidizing the silicon wafer 10 to form a thermal oxide film ($SiO_2$) or by carrying out a chemical vapor deposition method (CVD method) or physical vapor deposition method (PVD method) to form a layer of $SiO_2$ or a layer of the aforesaid metal oxide or the like.

When a thermal oxide film is formed, for example, the silicon wafer 10 is heat treated at 700 to 1200° C. in an air atmosphere to form a thermal oxide film on the surface of the silicon wafer 10. Examples of the CVD method include a thermal CVD method, a plasma CVD method, and an optical CVD method. Examples of the PVD method include a vapor deposition method, an ion plating method, and a sputtering method. The interlayer 11 has preferably a thickness of, for example, 100 to 5,000 nm.

In the step (d), the silicon wafer 10 on the side of the interlayer 11 is subjected to ion implantation treatment. By this treatment, most of the ions pass through the interlayer 11 and are accumulated in the upper layer portion (in the portion on the side of the interlayer 11) of the silicon wafer 10, and thus, a damaged layer 12 is formed. As for the conditions of the ion implantation treatment, as for the conditions of the ion implantation treatment, for example, the dosage of hydrogen atom ions (W) is preferably $2.5 \times 10^{16}$ atoms/cm² to $5.0 \times 10^{16}$ atoms/cm². When the dosage is less than $2.5 \times 10^{16}$ atom/cm², the damaged layer cannot be formed easily. When the dosage exceeds $5.0 \times 10^{16}$ atoms/cm², the subsequent thermal treatment may cause bubbles called microcavities in the silicon wafer 10 subjected to such ion implantation, deteriorate the surface roughness of the damaged layer, and make the surface state inappropriate for bonding. The dosage of hydrogen molecule ions ($H_2^+$) is preferably $1.25 \times 10^{16}$ atoms/cm² to $2.5 \times 10^{16}$ atoms/cm², which may produce an effect similar to that of the hydrogen atom ions.

The surface roughness of the damaged layer 12 can be expressed, for example, by an arithmetic average roughness Ra (JIS B 0601:2013). It can be observed and determined by an atomic force microscope (AFM). The arithmetic average roughness Ra is, for example, preferably 0.3 nm or less. The RMS is also called "root mean square roughness Rq" specified by JIS B 0601:2013 and is, for example, preferably 0.3 nm or less. Rmax represents the maximum height specified by JIS B 0601:2013 and is, for example, preferably 3.0 nm or less.

As for the acceleration energy of ions, that of hydrogen atom ions (W) is preferably 25 KeV to 200 KeV and that of hydrogen molecule ions ($H_2^+$) is preferably 50 KeV to 400 KeV. The depth of ion implantation can be changed by adjusting the acceleration energy. The thickness of the damaged layer 12 is preferably adjusted to 100 nm to 500 nm.

In the step (e), the silicon wafer 10 having the damaged layer 12 formed therein is subjected to thermal treatment. This enables the outward diffusion of a large number of excess ions remaining in the silicon wafer 10 by the ion implantation treatment. The thermal treatment temperature is preferably 400° C. or more. This ensures the outward diffusion of the excess ions and at the same time enables the formation of a damaged layer 12a. The upper limit of the thermal treatment temperature is not particularly limited, but it is, for example, preferably 800° C. or less.

In the step (f), the silicon wafer 10 and the second wafer 20 are bonded to each other via the interlayer 11 and the damaged layer 12a to obtain a laminate 30. Prior to the bonding, the surface of one or both of the silicon wafer 10 and the second wafer 20 to be bonded is subjected to surface activation treatment. The surface activation treatment is not particularly limited as long as it can activate the surface to be bonded. Examples include plasma activation treatment, vacuum ion beam method, ozone water treatment method, and UV ozone treatment method. As the atmosphere of the surface activation treatment, an inert gas such as nitrogen or argon and oxygen may be used either singly or in combination.

The laminate 30 obtained by bonding the silicon wafer 10 and the second wafer 20 to each other via the interlayer 11 and the damaged layer 12a may be subjected to thermal treatment. By this treatment, the laminate has increased bond strength.

In the step (g), the second wafer 20 of the laminate 30 is thinned into a single-crystal silicon thin film or oxide single-crystal thin film 20a. As a result, a composite substrate 40 having the single-crystal silicon thin film or oxide single-crystal thin film 20a formed on the silicon wafer 10 via the damaged layer 12a and the interlayer 11 can be obtained. The thickness of the single-crystal silicon thin film or oxide single-crystal thin film 20a is, for example, preferably 0.1 to 30 μm. As a thinning method of the second wafer 20, for example, grinding or polishing may be used, or a Smart-Cut method may also be used.

Specifically, the Smart-Cut method is a method of carrying out a step of subjecting the surface of the second wafer 20 to be bonded to ion implantation treatment in advance and thereby forming an ion implanted layer in the second wafer 20, leaving the ion implanted layer as the single-crystal silicon thin film or oxide single-crystal thin film 20a, and releasing the remaining portion of the second wafer 20 from the laminate 30. The release may be achieved by giving a mechanical impact with a wedge-shaped blade (not shown in the drawing) or giving a predetermined thermal treatment.

In the composite substrate 40 thus obtained, no bubbles, called microcavities, are generated therein even after the thermal treatment, no deterioration in the surface roughness is found from the damaged layer 12a, the single-crystal silicon thin film or oxide single-crystal thin film 20a are bonded to each other appropriately, and the excess ions in the silicon wafer 20 are sufficiently diffused outward, making it possible to prevent occurrence of film peeling even by the thermal treatment after bonding, or long-term use.

EXAMPLES

Examples and comparative examples will hereinafter be described, but the present invention is not limited to them.

Example 1

On the surface of a silicon wafer having a diameter of 150 mm, a 500-nm thermal oxide film ($SiO_2$ film) was formed by a thermal oxidation method (in a steam atmosphere of 1000° C.). The surface roughness Ra of the thermal oxide film at that time was 0.16 nm as a result of 10×10-μm atomic force microscopic (AFM) observation. The resulting wafer was subjected to ion implantation treatment with hydrogen ions (W) at a dosage of $3.6 \times 10^{16}$/cm² and an acceleration energy of 83 KeV. The surface roughness Ra of the thermal oxide film at that time was also 0.16 nm as a result of AFM observation. The thermal oxide silicon wafer single body obtained by thermal oxidation was subjected to thermal treatment at a temperature of 500° C. in a nitrogen atmosphere for 12 hours.

Figure 3:
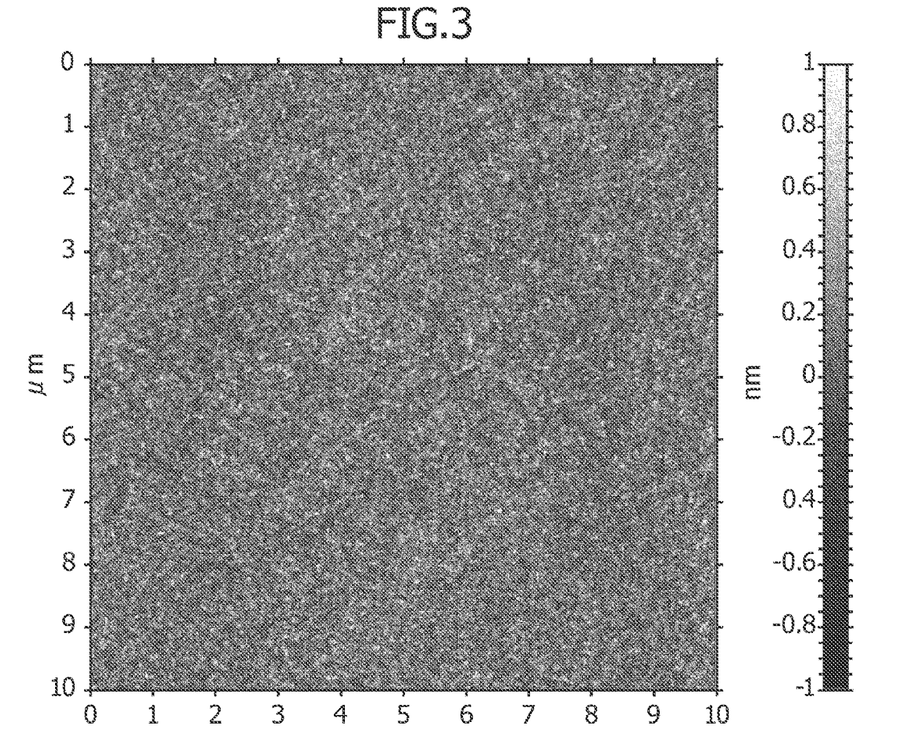
FIG. 3 is an atomic force microscope (AFM) image showing the surface of a thermal oxide film on the wafer of Example 1.
Figure 4:
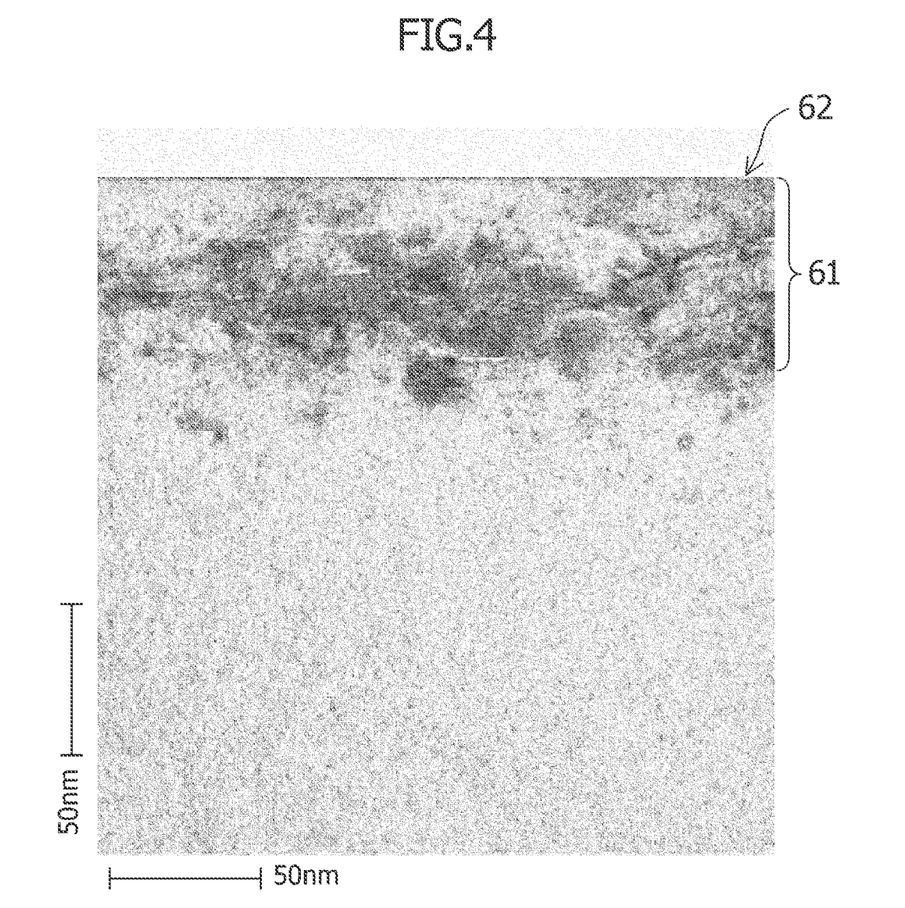
FIG. 4 is a transmission electron microscope (TEM) image showing the cross-section of the wafer of Example 1.

The surface roughness Ra of the thermal oxide film at that time was also 0.16 nm as a result of AFM observation, RMS was 0.20 nm, and Rmax was 1.92 nm. The AFM image of the surface of the thermal oxide film at that time is shown in FIG. 3. The transmission electron microscope (TEM) image of the cross-section of the wafer at that time is shown in FIG. 4. As FIG. 4 shows, it is confirmed that a damaged layer 61 is formed in the upper layer of the silicon wafer, but it is found that the damaged layer does not roughen the interface 62 between the thermal oxide film and silicon.

Example 2

On the surface of a first silicon wafer having a diameter of 150 mm, a 500-nm thermal oxide film ($SiO_2$ film) was formed by a thermal oxidation method (in a steam atmosphere of 1000° C.). The surface roughness Ra of the thermal oxide film at that time was 0.16 nm as a result of 10×10-μm AFM observation. The thermal oxide silicon wafer obtained by thermal oxidation was subjected to ion implantation treatment with hydrogen ions (W) at a dosage ranging from $1.5 \times 10^{16}$ to $5.5 \times 10^{16}$/cm² as shown in Table 1 and an acceleration energy of 83 KeV. The single bodies of the thermal oxide silicon wafer thus obtained after ion implantation were subjected to thermal treatment at the respective temperatures ranging from 300 to 800° C. as shown in Table 1. (In each case, retention time was 6 hours).

Next, each of the resulting wafers and a second silicon wafer were bonded to each other after surface activation treatment to obtain laminates. The resulting laminates were subjected to thermal treatment at 250° C. for 24 hours, followed by thinning the second silicon wafer to a thickness of 10 μm by grinding or polishing to obtain composite substrates. The composite substrates thus obtained were subjected to thermal treatment at 900° C. for 10 minutes. The temperature of 900° C. was selected as the maximum temperature in the production of a silicon device. The presence or absence of film peeling in each test example was studied. In addition, the formation of a damaged layer in the thermal oxide film was studied by the TEM observation of the cross-section of each test example. The results of whether or not a damaged layer was formed and film peeling occurred are shown in Table 1. It is to be noted that the numbers listed vertically in Table 1 are the dosage ($\times 10^{16}$/ cm$^2$) of hydrogen ions implanted and the numbers listed horizontally are the heat treatment temperature (° C.) given to the ion-implanted silicon wafer before bonding.

Figure 2:
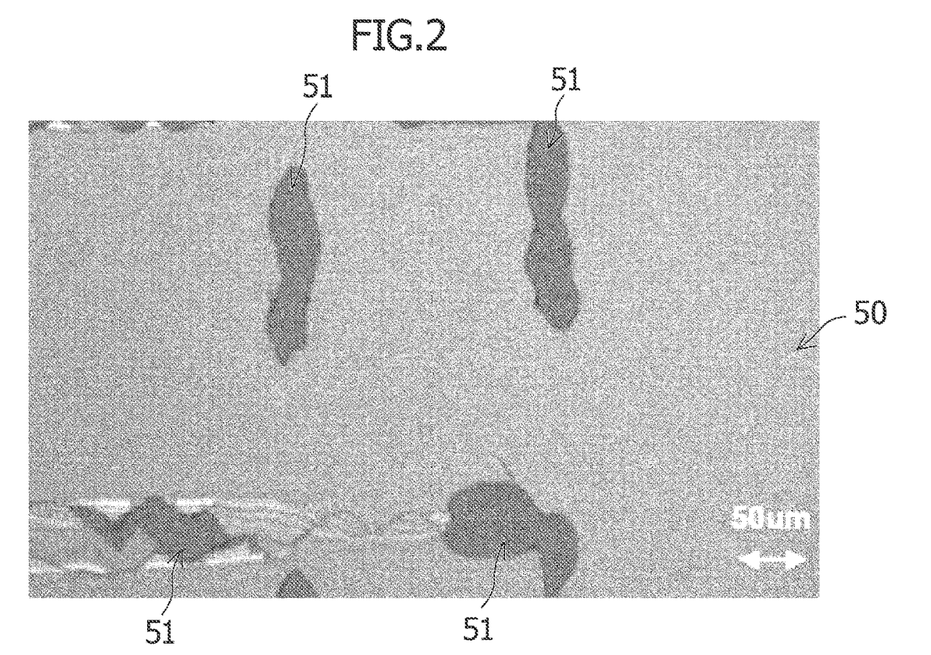
FIG. 2 is a photomicrograph showing the surface of a wafer in which film peeling occurred.

As shown in FIG. 2, a plurality of film peelings 51 occurred in the silicon wafer surface 50.

Example 3

In a manner similar to that of Example 2, except that a lithium tantalite (LT) wafer was used instead of the second silicon wafer, the LT wafer was thinned to a thickness of 5 μm by grinding or polishing, and the ion-implanted thermal oxide silicon wafers were heat treated at respective temperatures in a range of 300 to 600° C. as shown in Table 2 (600° C. was set as the upper limit temperature based on the curie point of LT), composite substrates were produced. The resulting composite substrates were treated at 300° C. for 30

TABLE 1

|     | 300 | 400 | 500 | 600 | 700 | 800 |
|-----|-----|-----|-----|-----|-----|-----|
| 1.5 | No damaged layer<br>No peeling | No damaged layer<br>No peeling | No damaged layer<br>No peeling | No damaged layer<br>No peeling | No damaged layer<br>No peeling | No damaged layer<br>No peeling |
| 2.0 | No damaged layer<br>No peeling | No damaged layer<br>No peeling | No damaged layer<br>No peeling | No damaged layer<br>No peeling | No damaged layer<br>No peeling | No damaged layer<br>No peeling |
| 2.5 | No damaged layer<br>No peeling | Damaged layer was formed slightly<br>No peeling | Damaged layer was formed slightly<br>No peeling | Damaged layer was formed slightly<br>No peeling | Damaged layer was formed slightly<br>No peeling | Damaged layer was formed slightly<br>No peeling |
| 3.0 | No damaged layer<br>No peeling | Damaged layer was formed<br>No peeling | Damaged layer was formed<br>No peeling | Damaged layer was formed<br>No peeling | Damaged layer was formed<br>No peeling | Damaged layer was formed<br>No peeling |
| 3.5 | No damaged layer<br>No peeling | Damaged layer was formed<br>No peeling | Damaged layer was formed<br>No peeling | Damaged layer was formed<br>No peeling | Damaged layer was formed<br>No peeling | Damaged layer was formed<br>No peeling |
| 4.0 | No damaged layer<br>No peeling | Damaged layer was formed<br>No peeling | Damaged layer was formed<br>No peeling | Damaged layer was formed<br>No peeling | Damaged layer was formed<br>No peeling | Damaged layer was formed<br>No peeling |
| 4.5 | No damaged layer<br>No peeling | Damaged layer was formed<br>No peeling | Damaged layer was formed<br>No peeling | Damaged layer was formed<br>No peeling | Damaged layer was formed<br>No peeling | Damaged layer was formed<br>No peeling |
| 5.0 | No damaged layer<br>No peeling | Damaged layer was formed<br>No peeling | Damaged layer was formed<br>No peeling | Damaged layer was formed<br>No peeling | Damaged layer was formed<br>No peeling | Damaged layer was formed<br>No peeling |
| 5.5 | No damaged layer<br>No peeling | Damaged layer was formed<br>Slight peripheral peeling | Damaged layer was formed<br>Slight peripheral peeling | Damaged layer was formed<br>Peripheral peeling | Damaged layer was formed<br>Peripheral and inner peeling | Damaged layer was formed<br>Peripheral and inner peeling |

As shown in Table 1, in the test examples showing the results that no film peeling was found, among the test examples in which a damaged layer (carrier trap layer) was formed, the dosage was in a range of 2.5×10$^{16}$ to 5.0×10$^{16}$/ cm$^2$. A photomicrograph of the surface of the wafer of the test examples in which a damaged layer was formed and peripheral and inner peelings was found is shown in FIG. 2.

minutes to study whether or not a damaged layer was formed and film peeling occurred. The results are shown in Table 2. The numbers listed vertically in Table 2 are the dosage (×10$^{16}$/cm$^2$) of the implanted hydrogen ions and the numbers listed horizontally are a thermal treatment temperature (° C.) given to the ion-implanted silicon wafers before bonding.

TABLE 2

|     | 300 | 350 | 400 | 500 | 550 | 600 |
|-----|-----|-----|-----|-----|-----|-----|
| 1.5 | No damaged layer<br>No peeling | No damaged layer<br>No peeling | No damaged layer<br>No peeling | No damaged layer<br>No peeling | No damaged layer<br>No peeling | No damaged layer<br>No peeling |
| 2.0 | No damaged layer<br>No peeling | No damaged layer<br>No peeling | No damaged layer<br>No peeling | No damaged layer<br>No peeling | No damaged layer<br>No peeling | No damaged layer<br>No peeling |
| 2.5 | No damaged layer<br>No peeling | No damaged layer<br>No peeling | Damaged layer was formed slightly<br>No peeling | Damaged layer was formed slightly<br>No peeling | Damaged layer was formed slightly<br>No peeling | Damaged layer was formed slightly<br>No peeling |
| 3.0 | No damaged layer<br>No peeling | No damaged layer<br>No peeling | Damaged layer was formed<br>No peeling | Damaged layer was formed<br>No peeling | Damaged layer was formed<br>No peeling | Damaged layer was formed<br>No peeling |

TABLE 2-continued

| | 300 | 350 | 400 | 500 | 550 | 600 |
|---|---|---|---|---|---|---|
| 3.5 | No damaged layer<br>No peeling | No damaged layer<br>No peeling | Damaged layer was formed<br>No peeling | Damaged layer was formed<br>No peeling | Damaged layer was formed<br>No peeling | Damaged layer was formed<br>No peeling |
| 4.0 | No damaged layer<br>No peeling | No damaged layer<br>No peeling | Damaged layer was formed<br>No peeling | Damaged layer was formed<br>No peeling | Damaged layer was formed<br>No peeling | Damaged layer was formed<br>No peeling |
| 4.5 | No damaged layer<br>No peeling | No damaged layer<br>No peeling | Damaged layer was formed<br>No peeling | Damaged layer was formed<br>No peeling | Damaged layer was formed<br>No peeling | Damaged layer was formed<br>No peeling |
| 5.0 | No damaged layer<br>No peeling | No damaged layer<br>No peeling | Damaged layer was formed<br>No peeling | Damaged layer was formed<br>No peeling | Damaged layer was formed<br>No peeling | Damaged layer was formed<br>No peeling |
| 5.5 | No damaged layer<br>No peeling | Damaged layer was formed<br>Slight peripheral peeling | Damaged layer was formed<br>Slight peripheral peeling | Damaged layer was formed<br>Peripheral peeling | Damaged layer was formed<br>Peripheral and inner peeling | Damaged layer was formed<br>Peripheral and inner peeling |

As shown in Table 2, in the test examples showing the results that no film peeling occurred, among the test examples in which a damaged layer (carrier trap layer) was formed, the dosage was in a range of $2.5 \times 10^{16}$ to $5.0 \times 10^{16}$/cm$^2$.

Example 4

In a manner similar to that of Examples 2 and 3, except that a silicon oxide film was formed on a silicon wafer by each of a CVD method and a PVD method instead of the thermal oxidation method and the surface was planarized by polishing, composite substrates were produced, and whether or not a damaged layer was formed and film peeling occurred were studied. The results were similar to those of Examples 2 and 3, revealing that the effect of the present invention did not depend on the formation method of an oxide film.

Example 5

In a manner similar to that of Examples 2 and 3 except that the activation treatment to a surface to be bonded was performed using each of a vacuum ion beam method, an ozone water treatment method, and a UV ozone treatment method instead of the plasma activation treatment, composite substrates were produced and whether or not they had a damaged layer and film peeling was studied. As a result, no significant difference due to the activation treatment used was found. The effect of the present invention was therefore found not to depend strongly on the method of the activation treatment. In addition, there was no large difference in the test results between the activation treatment given to one of the wafers and both thereof.

Example 6

In a manner similar to that of Examples 2 and 3, except that H$_2^+$ was used instead of H$^+$ as the ions to be implanted, the dosage was reduced by half, and an acceleration energy was doubled, composite substrates were produced and whether or not they had a damaged layer and film peeling was studied. As a result, the results thus obtained were similar to those of Examples 2 and 3.

Example 7

In a manner similar to that of Examples 2 and 3 except that the interlayer was formed using each of the following materials: SiON, SiN, Al$_2$O$_3$, TiO$_2$, Ta$_2$O$_5$, Nb$_2$O$_5$, Y$_2$O$_3$, and ZrO$_2$ instead of the thermal oxide film (SiO$_2$), composite substrates were produced and whether or not they had a damaged layer and film peeling was studied. As a result, the results thus obtained were similar to those of Examples 2 and 3.

Example 8

In a manner similar to that of Examples 2 and 3, except that thinning of the silicon wafer or LT wafer by grinding or polishing of the laminate was replaced by releasing a laminate, which was obtained by implanting hydrogen ions in advance to the surface of a silicon wafer or LT wafer to be bonded, followed by bonding, along the implanted interface, composite substrates were produced, and whether or not they had a damaged layer and film peeling was studied. As a result, the results thus obtained were similar to those of Examples 2 and 3.

REFERENCE SYMBOL LIST

10 Silicon wafer
11 Interlayer
12 Damaged layer
20 Single-crystal silicon wafer or oxide single-crystal wafer
20a Single-crystal silicon thin film or oxide single-crystal thin film
30 Laminate
40 Composite substrate

The invention claimed is:

1. A method for producing a composite substrate having a silicon wafer, an interlayer, and an oxide single-crystal thin film stacked in the order listed, comprising the steps of:
    forming the interlayer on a surface of the silicon wafer;
    subjecting a side of the interlayer of the silicon wafer to ion implantation treatment and then to thermal treatment at a temperature of 400° C. to 600° C. to form a damaged layer in a portion of the silicon wafer on the side of the interlayer;
    bonding the silicon wafer and an oxide single-crystal wafer to each other with the interlayer therebetween to obtain a laminate; and
    thinning the oxide single-crystal wafer of the laminate into the oxide crystal thin film,
    wherein ion species to be implanted by the ion implantation treatment are hydrogen atom ions (H$^+$) at a dose between $2.5 \times 10^{16}$ and $5.0 \times 10^{16}$ atoms/cm$^2$ or hydrogen molecule ions (H$_2^+$) at a dose between $1.25 \times 10^{16}$ and $2.5 \times 10^{16}$ atoms/cm$^2$.

2. The method for producing a composite substrate according to claim 1, wherein the interlayer comprises $SiO_2$, SiON, SIN, $Al_2O_3$, $TiO_2$, $Ta_2O_5$, $Nb_2O_5$, $Y_2O_3$, or $ZrO_2$.

3. The method for producing a composite substrate according to claim 1, wherein the interlayer is formed by thermally oxidizing the silicon wafer.

4. The method for producing a composite substrate according to claim 1, wherein the interlayer is formed by a chemical vapor deposition method (CVD method) or a physical vapor deposition method (PVD method).

5. The method for producing a composite substrate according to claim 1, wherein the oxide single-crystal wafer of the laminate is thinned by grinding or polishing, or a combination thereof.

6. The method for producing a composite substrate according to claim 1, further comprising a step of subjecting the surface of the oxide single-crystal wafer to be bonded to ion implantation treatment to form an ion implantation layer in the oxide single-crystal wafer,
   wherein the oxide single-crystal wafer of the laminate is thinned by leaving the ion implantation layer as an oxide single-crystal thin film and releasing the remaining portion of the oxide single-crystal wafer from the laminate.

\* \* \* \* \*